United States Patent [19]

Takahashi

[11] Patent Number: 4,929,059
[45] Date of Patent: May 29, 1990

[54] NON-LINEAR ELEMENT FOR LIQUID CRYSTAL DISPLAYS

[75] Inventor: Kotoyoshi Takahashi, Suwa, Japan

[73] Assignee: Seiko Epson Corporation, Tokyo, Japan

[21] Appl. No.: 282,239

[22] Filed: Dec. 9, 1988

[30] Foreign Application Priority Data

Dec. 10, 1987 [JP] Japan .................. 62-312608
Sep. 19, 1988 [JP] Japan .................. 63-234023

[51] Int. Cl.$^5$ ............................................. G02F 1/13
[52] U.S. Cl. .................. 350/334; 350/339 R
[58] Field of Search .......... 350/333, 334, 339 R, 350/336; 340/784; 357/6, 55

[56] References Cited

U.S. PATENT DOCUMENTS

| | | | |
|---|---|---|---|
| 4,413,883 | 11/1983 | Baraff et al. | 350/334 |
| 4,523,811 | 6/1985 | Ota | 350/339 R |
| 4,534,623 | 8/1985 | Azaki | 350/339 R |
| 4,683,183 | 7/1987 | Ono | 350/334 |
| 4,723,837 | 2/1988 | Masubuchi | 350/334 |
| 4,738,513 | 4/1988 | Nishiura et al. | 350/333 |
| 4,741,601 | 5/1988 | Saito | 350/339 R |
| 4,820,024 | 4/1989 | Nishiura | 350/333 |
| 4,861,141 | 8/1989 | Nakazawa | 350/334 |

Primary Examiner—Stanley D. Miller
Assistant Examiner—Tai Van Duong
Attorney, Agent, or Firm—Blum Kaplan

[57] ABSTRACT

A non-linear element is formed on a substrate as a laminate including a first electric conductor, a second electric conductor and an insulator sandwiched therebetween. A protective layer is formed on the substrate in the vicinity of the first electric conductor without coming in electric contact with the first electric conductor. The second electric conductor extends to the protective layer and is adhered thereto.

9 Claims, 5 Drawing Sheets

NON-LINEAR ELEMENT FOR LIQUID CRYSTAL DISPLAYS

BACKGROUND OF THE INVENTION

The present invention relates to a non-linear element and, in particular, to non-linear elements utilized in driving liquid crystal displays.

Reference is first made to FIGS. 1 and 2 wherein a conventional non-linear element, generally shown by the cross hatching of FIG. 1 and in detail in FIG. 2, for driving the picture element of a liquid crystal display device, is provided. A first electric conductor 1, an insulator 3 and a second electric conductor 2 are laminated together, forming the non-linear element generally indicated at 7. A picture element electrode 5 is supported on a substrate 6. First electric conductor 1 is connected to picture element electrode 5 through second electric conductor 2. First electric conductor 1 is made of tantalum (Ta), insulator 3 is made of tantalum oxide ($TaO_x$), electric conductor 2 is made of chromium (Cr) and picture element electrode 5 is made of a transparent conductive film of ITO. Each of the film is formed on substrate 6 which is made of glass.

A liquid crystal display device generally includes a glass substrate upon which a picture element electrode, a non-linear element for applying an electric charge to the picture element electrode and a wiring pattern for connecting adjacent picture elements are formed. A glass substrate disposed at a space interval of several microns has a pattern formed thereon to act as a counter electrode. A liquid crystal is sealed and oriented between the two glass substrates. In an exemplary embodiment, the two substrates are transparent to enhance their function as a display device for transmitting the light to the liquid crystal and controlling the amount of transmitted light.

A fluorescent light source is utilized. To control the amount of transmitted light, the fluorescent light is first linearly polarized by a polarizing plate. The polarized light enters the liquid crystal display device and the polarizing direction of the polarized light is changed by changing the orientation of the liquid crystal. The light is then transmitted through a polarizing plate changing the amount of light transmitted through the polarizing plate to achieve a display. Then, an appropriate electric potential is applied to the liquid crystal at the region wherein the orientation of the liquid crystal is to be changed, thus changing the orientation of the liquid crystal material. The minimum region to be changed is a picture element. Because the orientation of the liquid crystal can be changed by applying an electric potential, the amount of transmitted light can be controlled by the electric potential applied to the picture element.

In the prior art, each picture element comprises a non-linear element to maintain the electric potential once it has been applied until another potential is applied to the element. The ideal properties for such an element are that the resistance of the element becomes zero when the potential of the non-linear element is applied to the picture element and the resistance becomes infinity once the electric potential is being maintained.

Generally, when a non-linear element is utilized to drive a liquid crystal display, the area of the element should be small enough in comparison with the electrode area of the transparent picture element to obtain the above ideal element properties as near as possible. If the electrode area of the transparent picture element is $200 \times 200 \mu m^2$, the non-linear element is designed to have an area of $4 \times 4 \mu m^2$ or less. When determining the size for a non-linear element, various parameters must be taken into consideration. One of the most important parameters is the respective ratios of the capacitance or resistance of the transparent picture element electrode and the non-linear element. Another parameter of concern is the processing capability for manufacturing the non-linear element. Generally, the ratio of the area of the electrode of the transparent picture element to that of the non-linear element is set within the range of 1:1500 to 1:3000. If the electric potential difference between adjacent picture elements is several percent, it can be confirmed by eye measurement. Consequently, to obtain the same level of uniformity between the areas of the non-linear elements, each of the non-linear elements must have an area within $1/10 \mu m^2$.

The conventional non-linear elements have been satisfactory. However, they suffer from the fact that because the non-linear elements are extremely fine, it is difficult to form a large number of non-linear elements as required to drive 100,000 picture elements or more evenly over a wide area because dispersion occurs during the photo etching used as a method for forming the non-linear elements. It has also been difficult to improve the yield of the liquid crystal display which includes integrated non-linear elements.

Another disadvantage is that electric conductor 2 does not always adhere closely to substrate 6 resulting in electric conductor 2 separating from substrate 6 or breaking on substrate 6 decreasing the output of the liquid crystal display device which includes these integrated non-linear elements. In particular, when first electric conductor 1 is made of tantalum, second electric conductor 2 is made of chromium, substrate 6 is made of glass and dry etching is performed on the tantalum of first electric conductor 1 to form the non-linear element, the adhesion between the chromium of the second electric conductor 2 and the glass of substrate 6 is poor. This results in chromium separating from substrate 6 or wearing off of substrate 6. The defects in second electric conductor 2 in the vicinity of the stepped portion of first electric conductor 1 becomes quite great.

When forming non-linear element 7, it is preferred that a pattern be formed on first electric conductor 1 by dry etching. If wet etching were to be applied, the stepped portion at the end face of the pattern of first electric conductor 1 becomes too steep so that second electric conductor 2 breaks at the step portion without providing step coverage. A taper is formed at the step portion at the pattern end face of first electric conductor 1 through dry etching to improve the step coverage for second electric conductor 2. However, during formation, substrate 6 is exposed to plasma utilized during dry etching after the first electric conductor is etched. This results in a rough substrate surface. This roughness is even more pronounced in glasses containing many impurities, such as inexpensive glass. No discernable roughness is found in crystal glass such as quartz glass. When the substrate surface becomes rough, the roughened surface increases the occurrence of electric conductor 2 falling off of substrate 6 or wearing off of substrate 6.

Additionally, tantalum or silicon which are etched by dry etching are sometimes redeposited on the substrate as carbon polymers, which cannot be removed by the plasma utilized during the etching. The carbon polymer deposited on the substrate often forms a belt on the substrate at a position several micrometers from the step portion of the pattern and face of the first electric conductor. This results in a decreased adhesion of the electric conductor formed at the belt resulting in the wearing off or falling off of second electric conductor 2 as seen in FIGS. 3 and 4. The defects in the pattern of second electrode conductor 2 occur at a rate of several percent to tens of percent, thereby greatly deteriorating the output of non-linear element 7.

Accordingly, it is desirable to provide a non-linear element which overcomes the shortcomings of the prior art devices described above.

SUMMARY OF THE INVENTION

Generally, a non-linear element formed on a substrate includes a first electric conductor, a protective layer formed on the substrate in the vicinity of the non-linear element, an insulator formed on the first electric conductor and a second electric conductor formed on the insulator and on the protective layer, wherein the insulator, second electric conductor and first electric conductor form a laminate on the substrate.

The insulator is formed of a semiconductor material, such as tantalum oxide.

Accordingly, it is an object of the invention to provide an improved non-linear element.

Another object of the invention is to provide a non-linear element which allows the formation of a greater number of non-linear elements evenly provided over a wide region.

Yet, another object of the invention is to provide a non-linear element which reduces the occurrence of defects in the electric conductor.

A further object of this invention is to provide a non-linear element which improves the output of liquid crystal display devices utilizing integrated non-linear elements.

Still other objects and advantages of the invention will in part be obvious and will in part be apparent from the specification and drawings.

The invention accordingly comprises features of construction, combination of elements and arrangement of parts which will be exemplified in the constructions hereinafter set forth and the scope of the invention will be indicated in the claims.

BRIEF DESCRIPTION OF THE DRAWINGS

For a fuller understanding of the invention, reference is made to the following description taken in connection with the accompanying drawings, in which.

DETAILED DESCRIPTION OF THE PREFERRED EMBODIMENTS

Figure 1:
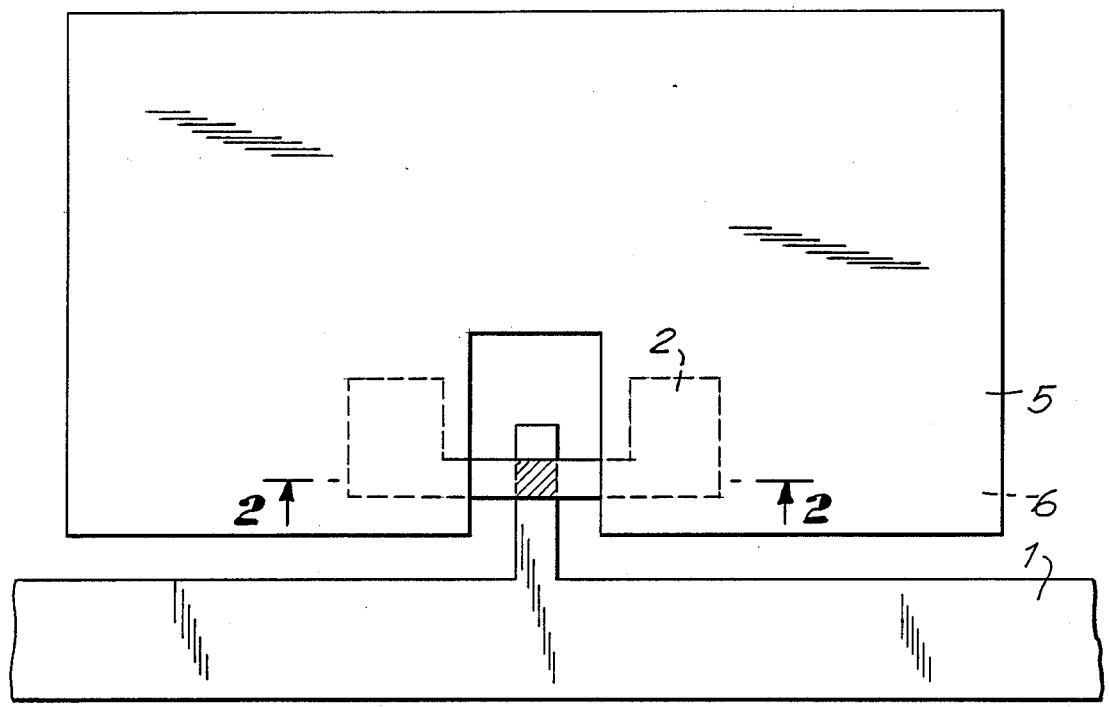
FIG. 1 is a top plan view of a non-linear element constructed in accordance with the prior art.
Figure 2:
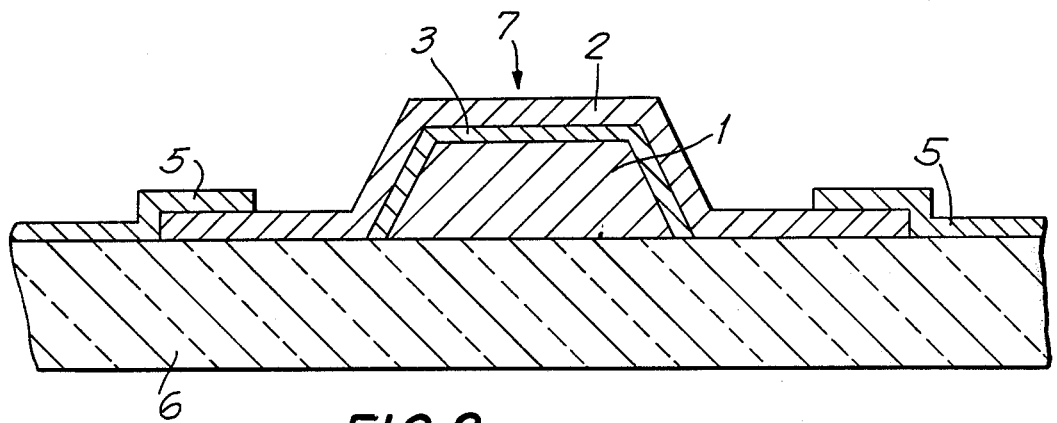
FIG. 2 is a cross-sectional view taken along line 2—2 or FIG. 1.
Figure 3:
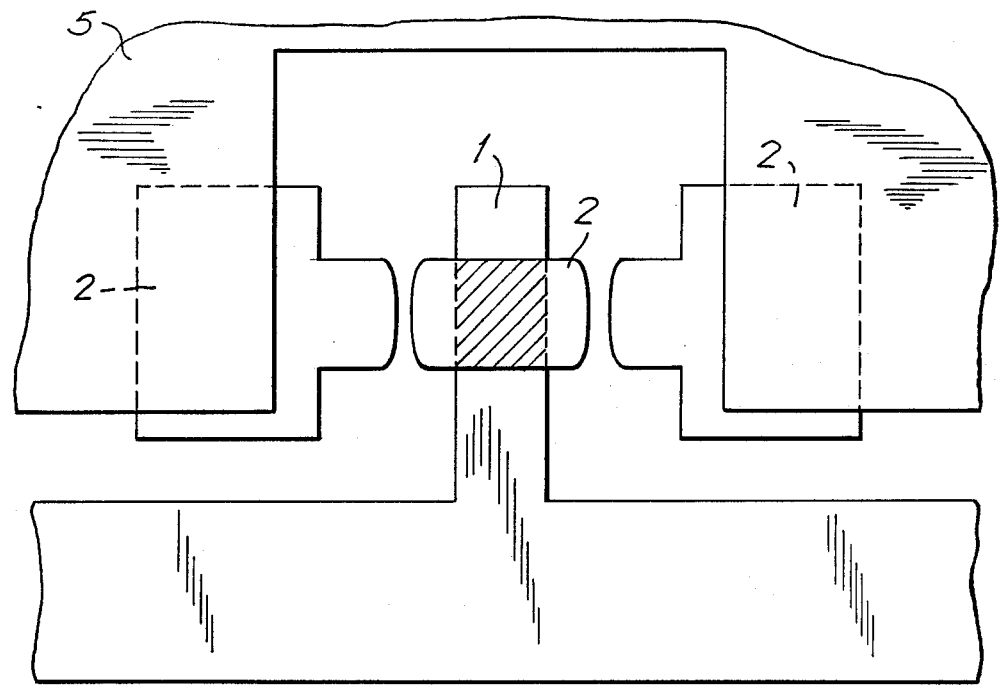
FIG. 3 is a top plan view of a non-linear element constructed in accordance with the prior art.
Figure 4:
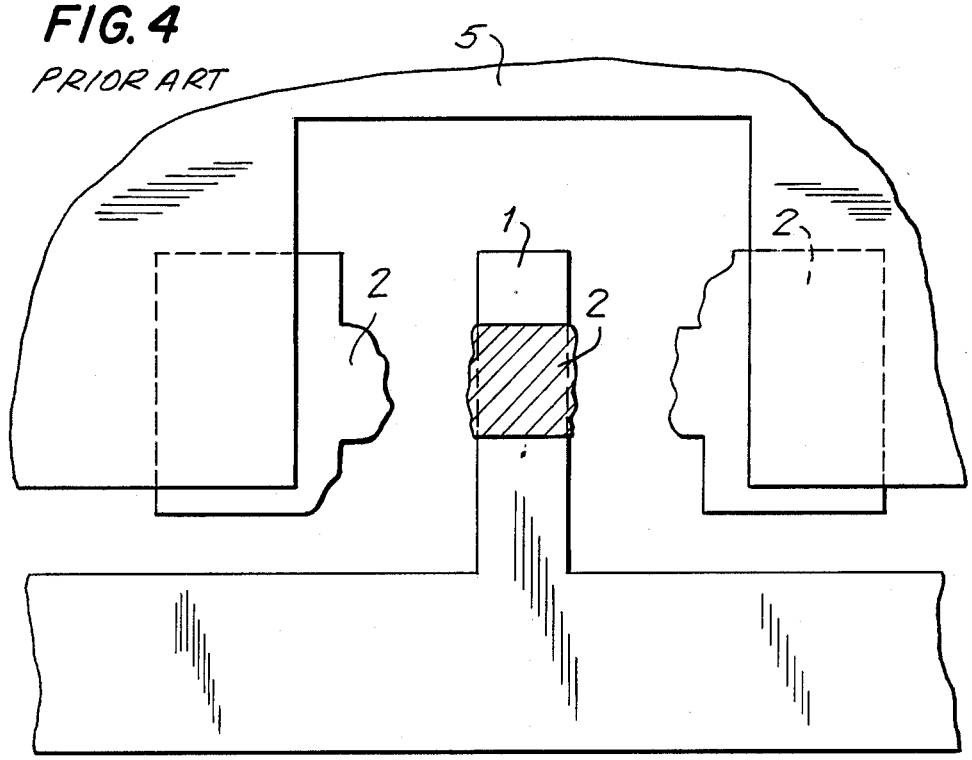
FIG. 4 is a top plan view of a defective non-linear element constructed in accordance with the prior art.
Figure 5:
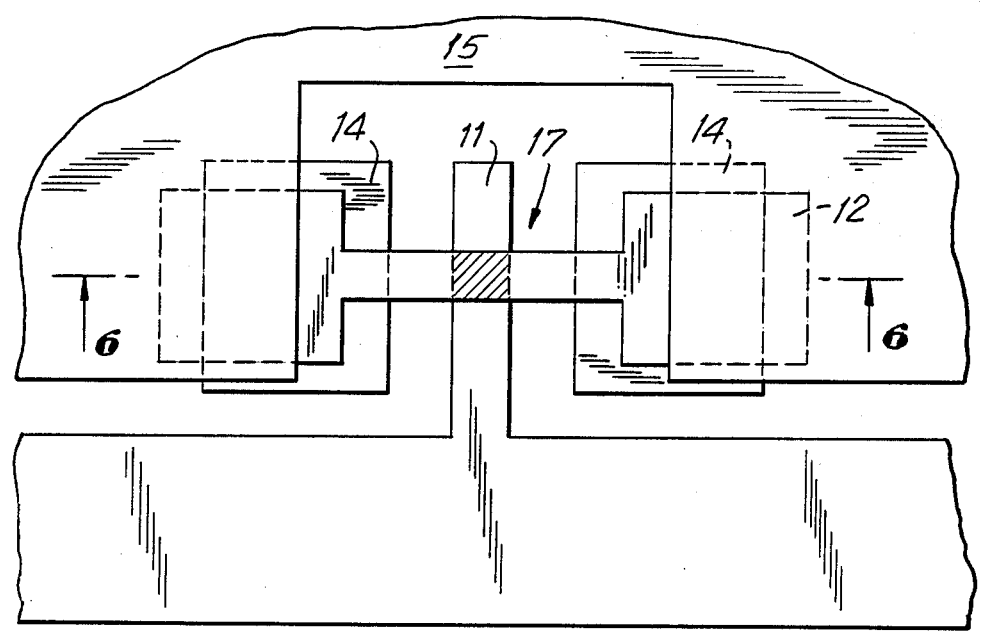
FIG. 5 is a top plan view of a non-linear element constructed in accordance with the invention.
Figure 6:
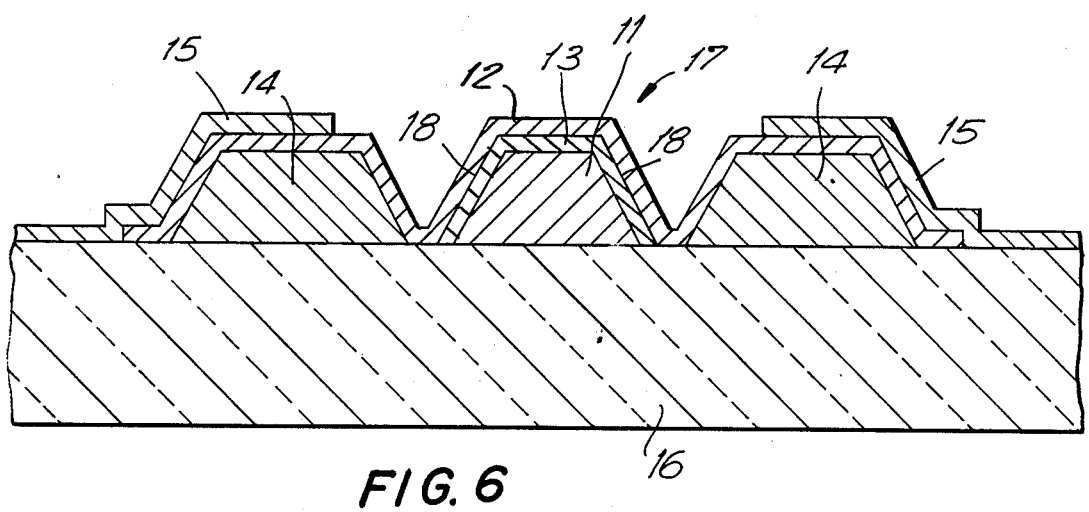
FIG. 6 is a sectional view taken along line 6—6 of FIG. 5.

Reference is made to FIGS. 5 and 6 wherein a non-linear element, generally indicated at 17, for driving the picture element of a liquid crystal display device in accordance with the invention is provided. By way of example, non-linear element 17 is a metal insulator metal ("MIM") element generally having a first electric conductor 11 made of tantalum (Ta), an insulator 13 made of tantalum oxide ($TaO_x$) and a second electric conductor 12 made of chromium (Cr).

Non-linear element 17 is represented by the shaded lines of FIG. 5. It is desirable to keep the area of non-linear element 17 small to obtain the desired element properties. Non-linear element 17 acts as a capacitor. During application, it is desirable to have the capacitive properties of non-linear element 17 be small for electric efficiency. Variation in size of the element directly affects the properties of the element which causes defects in display quality. As described above, a large number of small non-linear elements should be uniformly formed.

MIM element 17 is formed on substrate 16 and includes a Ta first electric conductor 11, a Cr electric conductor 12 with a $TaO_x$ insulator 13 sandwiched therebetween. A Ta protective layer 14 is formed on substrate 16 separated from MIM element 17 but in the vicinity of a slanted portion 18 of MIM element 17 on either side of protective layer 14. If both protective layer 14 and MIM element 17 are formed of a common material, such as Ta, dislocation of the position of protective layer 14 with respect to the position of MIM element 17 due to misalignment is avoided. Additionally, such a structure aids in miniaturizing MIM element 17 and providing a uniform MIM element 17 where the Ta patterning is done by etching.

This structure enhances miniaturization and uniformity because the size of the Ta region to be formed as MIM element 17 is generally several microns or less. On the other hand, the size or the other Ta regions such as the wiring between picture elements and terminals is normally 10μm to 100μm which is extremely large in comparison. Furthermore, the region for MIM element 17 and the region for the wiring and terminal can be formed by a single photo etching process. The etching rate of the region which is formed into MIM element 17 is done the fastest causing the largest variation in the size of MIM element 17. Accordingly, the size difference and simultaneous etching cause dimensional variations.

This variation results from two factors, the variation in the etching rate itself and the composition of the area surrounding the region in which MIM element 17 is formed. In connection with the variation of the etching rate itself, the etching rate at the peripheral region on a substrate is slower than the etching rate at the fast central region of a substrate. This variation is due to an uneven distribution of plasma density during dry etching over the surface of the substrate. In connection with the variation attributable to the surrounding regions, the variation of the etching rate depends upon whether patterns exist in the vicinity or the region forming the MIM element. If a pattern exists, the etching rate will vary due to the density or size of the pattern.

Generally, the patterns to be left on the substrate are covered by a resist to prevent complete etching, while the other uncovered regions are removed by the etching. The rate of etching the metal in MIM element 17 is fast when patterns do not exist in the vicinity of the region in which MIM element 17 is formed. Conversely, the etching rate is slow when patterns exist in the vicinity of the region in which MIM element 17 is formed. Accordingly, the rate of etching the metal of the MIM element 17 at the central portion of a display is faster than at the peripheral region of a display, even if there is no variation of etching during the manufacturing process. This results because in a liquid crystal display device, there are basically only picture elements in the vicinity of the center of the display so that the pattern density, i.e. resist density, is low. On the other hand, in the vicinity of the periphery of the display there are patterns for terminal portions for connecting with the outside so that the pattern density (resist density) is high. Consequently, the variation of the size of MIM element 17 becomes large, and particularly, the finer MIM element 17 becomes, the larger the dispersion becomes.

On the other hand, in accordance with the construction of non-linear element 17, by providing a protective layer formed in the vicinity of Ta first electric conductor 11, the etching rate becomes uniformly slow due to the existence of protective layer 14 in a vicinity of the Ta first electric conductor 11 of MIM element 17 regardless of the positioning of MIM element 17 on substrate 16, resulting in improved uniformity. The etching rate varies due to the distance between protective layer 14 and MIM element 17, so that the nearer protective layer 14 is to MIM element 17 the slower the etching rate becomes. This tendency becomes even more pronounced when the Ta is dry etched. Accordingly, the etching rate of the Ta regions forming MIM element 17 can be freely controlled to some extent, reducing the etching rate variations during designing or processing of the Ta pattern.

As seen in FIGS. 5 and 6, second electric conductor 12 covers insulator 13 and protective layers 14. As discussed above, the adhesion of Cr second electric connector 12 to substrate 6 is poor and therefore second electric conductor 12 either comes off of substrate 16 or breaks. However, because Cr adheres closely to Ta even if the adhesion between Cr and the substrate material is poor, second electric conductor 12 remains fixed in place because of its adhesion to protective layer 14. The effect is even more clear when substrate 16 is made of glass and the Ta pattern is formed by dry etching.

Generally, dry etching is the method used for etching Ta. Glass substrate 16 is exposed to plasma such as a $\overline{COF}$ radical during etching. Glass substrate 16 does not exhibit poor adhesion properties to the metal Ta. However, when the glass substrate includes impurities such as in the case of inexpensive glass, poor adhesion becomes quite noticeable. The Cr layer which forms second electric conductor 12 of MIM element 17 should be made extremely fine, not exceeding several microns, due to the requirement for miniaturization. Additionally, the Cr portion of MIM element 17 requires a length including a margin with respect to alignment precision to the Ta pattern as shown in FIG. 5.

In the conventional liquid crystal display device, many defects occur in the Cr portion of the non-linear element. As discussed, there is poor adhesion between the Cr layer and substrate resulting in the falling off of the Cr layer or the Cr layer becoming broken. However, where a Ta protective layer 14 is formed under Cr second electric conductor 12, the region wherein Cr second electric conductor 12 actually does come in contact with substrate 16 should be made narrow and the portion of Cr second electric conductor 12 which contacts protective layer 14 should be broad. The region in which Cr electric contact 12 is easily broken or removed from the substrate has now been narrowed which reduces the occurrence of defects. Additionally, the re-deposition of Ta during etching of Ta first electric conductor 1 is reduced due to the simultaneous etching of adjacent protective layer 14 thus reducing poor pattern formations due to the re-deposition.

Figure 7:
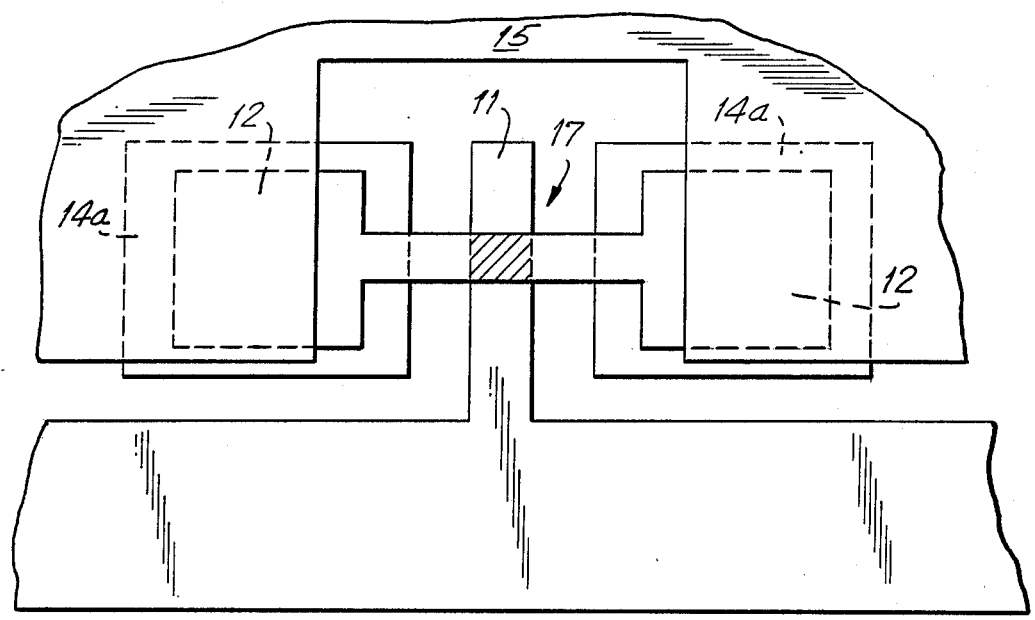
FIG. 7 is a top plan view of a second embodiment of a non-linear element constructed in accordance with the invention.

Reference is now made to FIG. 7 in which a second embodiment of non-linear element 27 is provided. This embodiment is identical to that of FIG. 6, however the area of protective layer 14a has been increased to broaden the adhesion area with second electric conductor 12. Accordingly, the adhesion between Cr second electric conductor 12 and protective layer 14 is increased.

Figure 8:
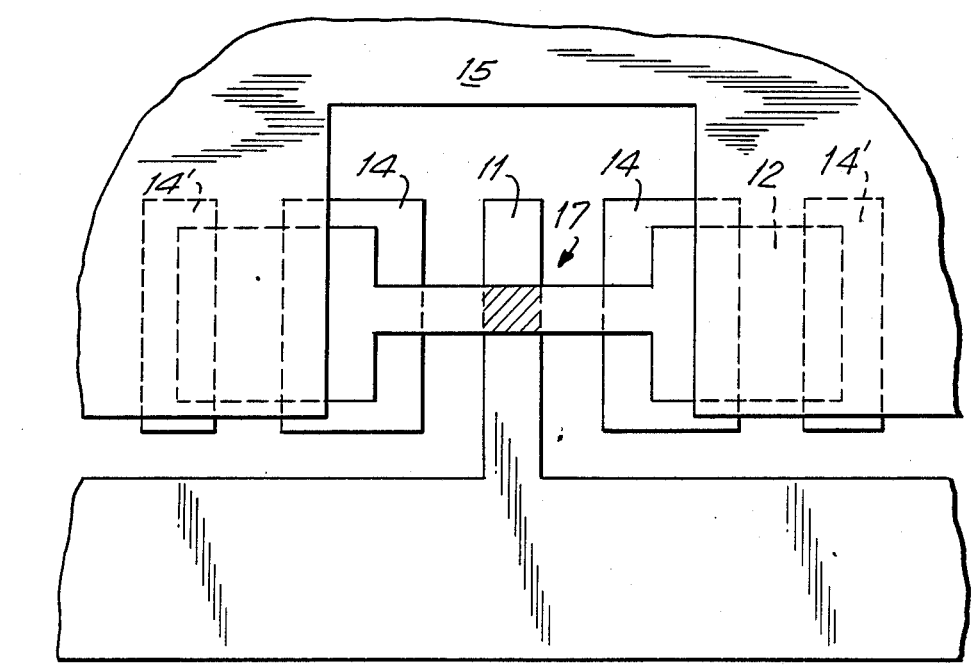
FIG. 8 is a top plan view of a third embodiment of a non-linear element constructed in accordance with the invention.

Reference is now made to FIG. 8, in which a third embodiment of a non-linear element, generally indicated at 37, constructed in accordance with the invention is provided to avoid the situation in which ITO picture element electrode 15 does not provide step coverage at the step portion of protective portion 14. Accordingly, two protective layers 14, 14' are provided at either side of non-linear element 17. Cr second conductor 12 contacts ITO picture element electrode 15 at a region between Ta protective layers 14, 14' in a manner identical to the contacting of substrate 16 by second electric conductor 12 between MIM element 17 and protective layer 14. This maintains the adhesion of Cr second electric conductor 12 while insuring that step coverage for the step portions of Ta protective layers 14, 14' are not required by ITO picture element electrode 15.

Figure 9:
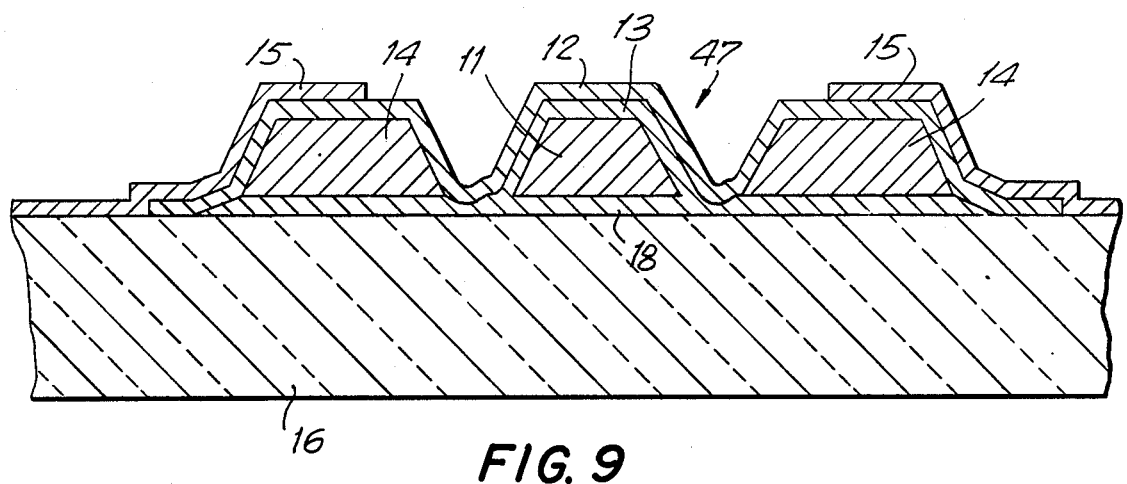
FIG. 9 is a sectional view of a non-linear element constructed in accordance with a fourth embodiment of the invention.

Reference is now made to FIG. 9 in which another embodiment of a non-linear element, generally indicated at 47, constructed in accordance with a fourth embodiment of the invention, is depicted. An insulator film 18 is formed on substrate 16 before the forming of Ta first electric conductor Il. This improves the adhesion between substrate 16 and Ta first electric conductor 11 thus improving the overall adhesion for Ta first electrode 11 and Cr second electric conductor 12. In an exemplary embodiment, the insulator may be made of tantalum oxide ($TaO_x$).

Normally, $TaO_x$ film 18 is etched during the formation of the tantalum pattern. If etching is performed evenly over the entire substrate 16, only the tantalum pattern can be etched utilizing the $TaO_x$ insulating layer 18 as a bed. As a result, the adhesion of Cr second electric conductor 12 is increased.

Generally, etching is not evenly performed due to process variations and the influences of the tantalum pattern. The etching should be performed in accordance with the portion having the slowest etching rate. Mainly, the bed of tantalum oxide does not remain in a region where high Cr adhesion is required, i.e. in the vicinity of the portion in which MIM element 47 is formed. The tantalum oxide bed is merely utilized to increase the adhesion of tantalum portions 14 to substrate 16. Then, if protective layers 14 are formed in the vicinity of MIM element 47 at the same time of the pattern formation, the etching rate of the region between protective layer 14 and MIM element 47 becomes low and insulator film 18 remains as a bed at the portion where Cr second electric conductor 12 is fine and high adhesion is required. Consequently, the adhesion of the Cr to substrate 16 can be increased thereby reducing the falling off and wearing off of Cr electric contact 12.

Figure 10:
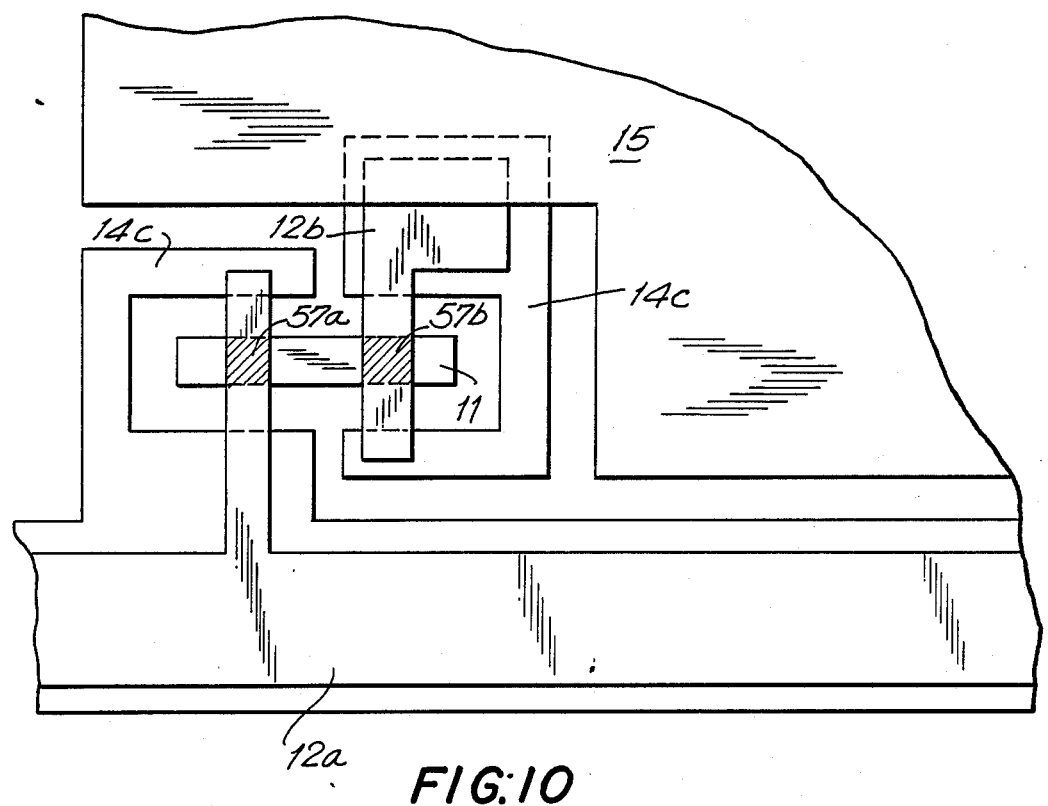
FIG. 10 is a top plan view of a non-linear element constructed in accordance with a fifth embodiment of the invention.

Reference is now made to FIG. 10 wherein a fifth embodiment of non-linear elements, generally indicated at 57a, 57b connected in series, is provided. Non-linear element 57a is made of a laminate including a first electric conductor 11, an insulator and a first second electric conductor 12a. Electric conductor 12a adheres to a first protective layer 14c. Similarly, non-linear element 57b is formed of a laminate including first electric conductor 11, second electric conductor 12b and an insulator. Second electric conductor 12b is bonded to a protective layer 14c.

The overall features of the MIM element of FIG. 10 are made to be equal to that of the miniaturized MIM elements discussed above.

Connecting MIM element 57a, 57b in series results in improved electrical symmetric properties of the overall MIM element. Although each of the MIM elements is structurally asymmetrical, such as Ta/TaO$_x$/Cr, it becomes symmetrical as in a Cr/TaO$_x$/Ta/TaO$_x$/Cr construction as a result of the two MIM element arrangement. In this embodiment, protective layer 14c is made as wide as possible below the Cr pattern of first second electric conductor 12a. The wiring portion between elements 57a, 57b is formed by two layers of Ta and Cr, so that the wiring resistance is reduced to be applicable to large sized pictures of liquid crystal display devices. Additionally, the insulator is made of TaO$_x$ in this embodiment. However, an insulator made of a semiconductor film will result in the same effect.

By providing protective layers upon which to adhere the Cr layer, a liquid crystal display device which includes a large number of non-linear elements spread over a wide region is now possible. Because the dispersion of features due to unevenness or the non-linear elements and defects within the Cr layer such as falling off or wearing off from the substrate are eliminated improving the output of the non-linear element. Accordingly, a high quality liquid crystal display device such as a device having a large number of non-linear elements evenly integrated over a wide region can be produced with a high output.

Because the structure of the invention is achieved by changing the conventional pattern or layers, the cost of production is the same as production of a conventional non-linear element. Additionally, such a structure lends itself to mass production.

It will thus be seen that the objects set forth above, and those made apparent by the preceding description are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention which, as a matter of language, might be said to fall therebetween.

What is claimed is:

1. A non-linear element formed on a substrate comprising a first electric conductor formed as a first island on said substrate, an insulator formed on said first electric conductor, a second electric conductor formed on said insulator forming a laminate of said first electric conductor, insulator and second electric conductor, a protective layer formed as a second island and a third island one said substrate on opposed sides of said first island in the vicinity of said first electric conductor, the first electric conductor being out of electrical contact with said protective layer, and said second electric conductor extending to said protective layer and being adhered thereto, the first island, second island and third island being formed of the same material, said protective layer preventing said second electrode from disconnecting from said substrate.

2. The non-linear element of claim 1, wherein said insulator is made of a semiconductor material.

3. The non-linear element of claim 1, wherein the protective layer has an area greater than the area of the portion of said second electric conductor which adheres to said protective layer.

4. The non-linear element of claim 1, wherein said non-linear element comes in contact with a picture element electrode and wherein said protective layer comprises two protective portions on either side of said non-linear element, said protective portions being spaced a distance apart from each other, and said second electric conductor contacting said picture element electrode at a portion between said two protective portions.

5. The non-linear element of claim 1, further comprising an insulating layer formed on said substrate, and said protective layer and first electric conductor are formed on said insulator layer.

6. A non-linear element comprising a first non-linear element according to claim 1 and, a second non-linear element according to claim 1 in series with said first non-linear element.

7. The non-linear element of claim 1, wherein the first electric conductor is made of tantalum, the second electric conductor is made of chromium and the insulator is made of tantalum oxide.

8. The non-linear element of claim 1, where said protective layer is formed from tantalum.

9. A non-linear element forming on a substrate comprising a first electric conductor formed on said substrate, said first electric conductor formed as an island having a first side and a second side opposed to said first side, a protective layer formed on said substrate adjacent said first side and said second side of said island being out of electrical contact with said island, the protective layer being formed as a second island and a third island, an insulator formed on said first electric conductor, a second electric conductor formed on said insulator forming a laminate of said second electric conductor, insulator and first electric conductor, and extending to adhere to said second island and third island, said protective layer preventing said second electrode from disconnecting from said substrate.

* * * * *